(12) United States Patent
Kutsukake

(10) Patent No.: US 9,721,966 B2
(45) Date of Patent: Aug. 1, 2017

(54) SEMICONDUCTOR DEVICE AND METHOD FOR MANUFACTURING THE SAME

(71) Applicant: Kabushiki Kaisha Toshiba, Minato-ku (JP)

(72) Inventor: Shizuka Kutsukake, Yokkaichi (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 15/047,798

(22) Filed: Feb. 19, 2016

(65) Prior Publication Data
US 2017/0077126 A1    Mar. 16, 2017

Related U.S. Application Data

(60) Provisional application No. 62/217,420, filed on Sep. 11, 2015.

(51) Int. Cl.
| | | |
|---|---|---|
| H01L 27/115 | (2017.01) | |
| H01L 27/11582 | (2017.01) | |
| H01L 27/11568 | (2017.01) | |
| H01L 27/11573 | (2017.01) | |
| H01L 21/28 | (2006.01) | |

(52) U.S. Cl.
CPC .. *H01L 27/11582* (2013.01); *H01L 21/28282* (2013.01); *H01L 27/11568* (2013.01); *H01L 27/11573* (2013.01)

(58) Field of Classification Search
CPC .......... H01L 27/11526–27/11546; H01L 27/11551–27/11556; H01L 27/11573; H01L 27/11578–27/11582
See application file for complete search history.

(56) References Cited

U.S. PATENT DOCUMENTS

| | | | |
|---|---|---|---|
| 8,049,267 B2 | 11/2011 | Sugimae et al. | |
| 8,498,139 B2 | 7/2013 | Suzuki et al. | |
| 8,604,517 B2 | 12/2013 | Noguchi et al. | |
| 2012/0161217 A1* | 6/2012 | Sato ................ | H01L 27/11526 257/296 |
| 2014/0070301 A1* | 3/2014 | Sonoda ............ | H01L 27/11529 257/324 |
| 2015/0060984 A1* | 3/2015 | Shimizu ........... | H01L 29/7881 257/316 |

* cited by examiner

*Primary Examiner* — Bryan Junge
(74) *Attorney, Agent, or Firm* — Oblon, McClelland, Maier & Neustadt, L.L.P.

(57) ABSTRACT

According to one embodiment, a semiconductor device includes a substrate, a first electrode layer, a second electrode layer, a third electrode layer, a fourth electrode layer, a first gate electrode layer, a second gate electrode layer, a gate insulating film, a first interlayer insulating film, a second interlayer insulating film. The first electrode layer is separated from the substrate in a first direction. The second electrode layer is separated from the first electrode layer in a second direction. The third electrode layer is provided between the first electrode layer and the second electrode layer. The third electrode layer includes a first edge face. A second edge face of the first gate electrode layer at the second gate electrode layer side is along the first edge face.

4 Claims, 19 Drawing Sheets

SEMICONDUCTOR DEVICE AND METHOD FOR MANUFACTURING THE SAME

CROSS-REFERENCE TO RELATED APPLICATIONS

This application is based upon and claims the benefit of priority from U.S. Provisional Patent Application 62/217,420, filed on Sep. 11, 2015; the entire contents of which are incorporated herein by reference.

FIELD

Embodiments described herein relate generally to a semiconductor device and a method for manufacturing the same.

BACKGROUND

A NAND flash memory includes a memory cell region, a row decoder, a sense amplifier, and peripheral circuit parts. In the NAND flash memory, the sense amplifier is used to detect the presence or absence of cell current flowing through the memory cell, or the magnitude of the current, to determine whether the data bit is "0" or "1". The sense amplifier is connected to a bit line to which a large number of memory cells are connected. An all bit line (ABL) sense amplifier has been proposed in which, during a sensing operation, the bit line potential is controlled so as to be at a fixed voltage, thereby mitigating effects on other adjacent bit lines. In this ABL sense amplifier, the sense node and the bit line are pre-charged, after which the electric charge in the capacitor of the sense node is discharged. Detecting the voltage level of the sense node after discharge determines the data bit to be "0" or "1". In the ABL sense amplifier, the capacitor elements (sense amplifier capacitors) having same numbers as the numbers of bit lines are provided.

DETAILED DESCRIPTION

Figure 1:
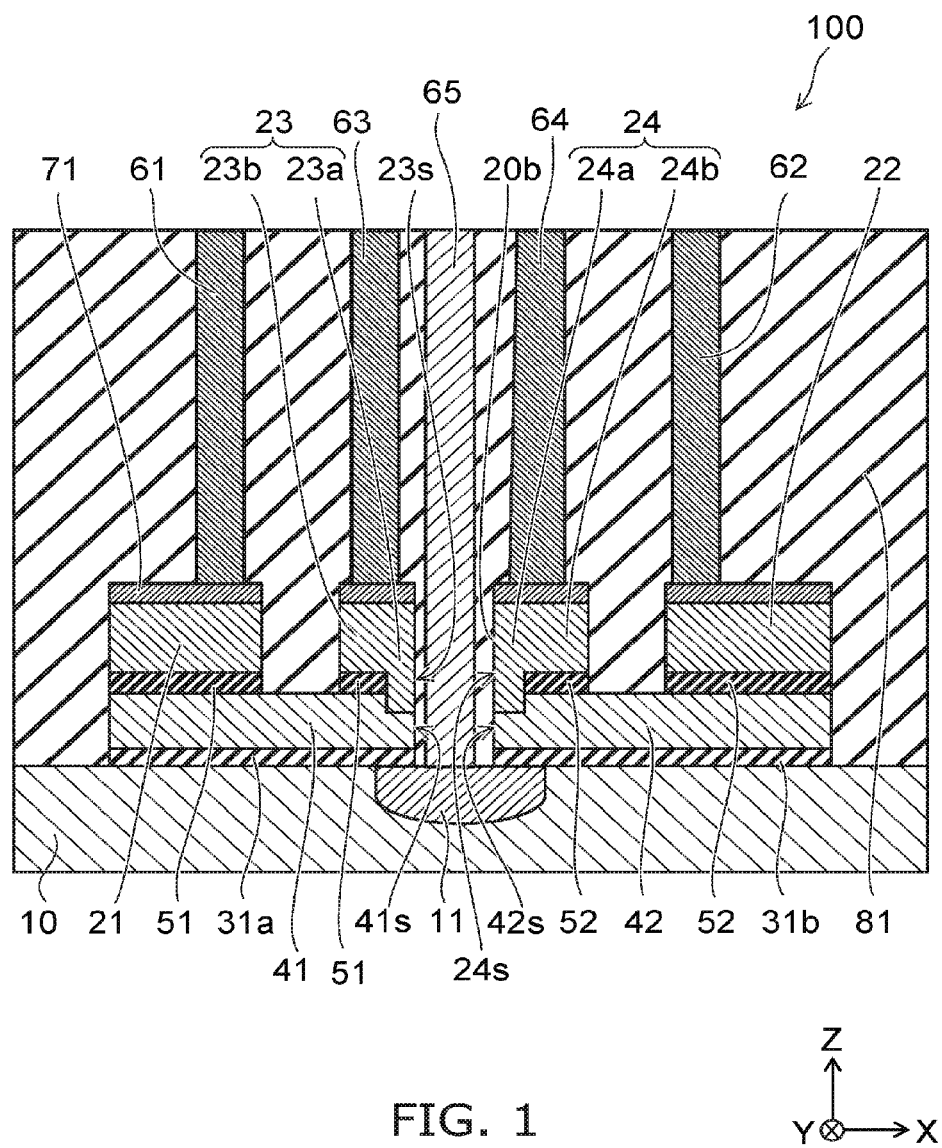
FIG. 1 is a cross-sectional view illustrating a semiconductor device according to a first embodiment.

According to one embodiment, a semiconductor device includes a substrate, a first electrode layer, a second electrode layer, a third electrode layer, a fourth electrode layer, a first gate electrode layer, a second gate electrode layer, a gate insulating film, a first interlayer insulating film, a second interlayer insulating film. The first electrode layer is separated from the substrate in a first direction. The second electrode layer is separated from the substrate in the first direction. The second electrode layer is separated from the first electrode layer in a second direction perpendicular to the first direction. The third electrode layer is provided between the first electrode layer and the second electrode layer. The third electrode layer includes a first region and a second region. The second region is provided between a part of the first region and the first electrode layer. The fourth electrode layer is provided between the second electrode layer and the third electrode layer. The first gate electrode layer is provided between the first electrode layer and the substrate and between the third electrode layer and the substrate. The second gate electrode layer is provided between the second electrode layer and the substrate and between the fourth electrode layer and the substrate. The first gate electrode layer is electrically connected to the first region. The first gate insulating film is provided between the first gate electrode layer and the substrate. The second gate insulating film is provided between the second gate electrode layer and the substrate. The first interlayer insulating film is provided between the first electrode layer and the first gate electrode layer and between the second region and the first gate electrode layer. The second interlayer insulating film is provided between the second electrode layer and the second gate electrode layer and between at least a part of the fourth electrode layer and the second gate electrode layer. The third electrode layer includes a first edge face on a side of the fourth electrode layer. The first edge face is included in the first region. The part of the first edge face overlaps the first interlayer insulating film in the second direction. At least a part of the first region is provided between the second region and the fourth electrode layer and between the first interlayer insulating film and the fourth electrode layer. The first gate electrode layer includes a second edge face on a side of the fourth gate electrode layer. The second edge face is provided along the part of the first edge face.

Embodiment of the invention will be described hereinafter with reference to the accompanying drawings.

Note that, the drawings are schematic or conceptual. Relations between thicknesses and widths of portions, ratios of sizes among the portions, and the like are not always the same as real ones. Even when the same portions are shown, the portions are sometimes shown in different dimensions and ratios depending on the drawings. Note that in the specification and the drawings, components described with reference to the drawings already referred to are denoted by the same reference numerals and signs. Detailed description of the components is omitted as appropriate.

A first embodiment will be described.

FIG. 1 is a cross-sectional view illustrating a semiconductor device according to this embodiment.

Figure 2:
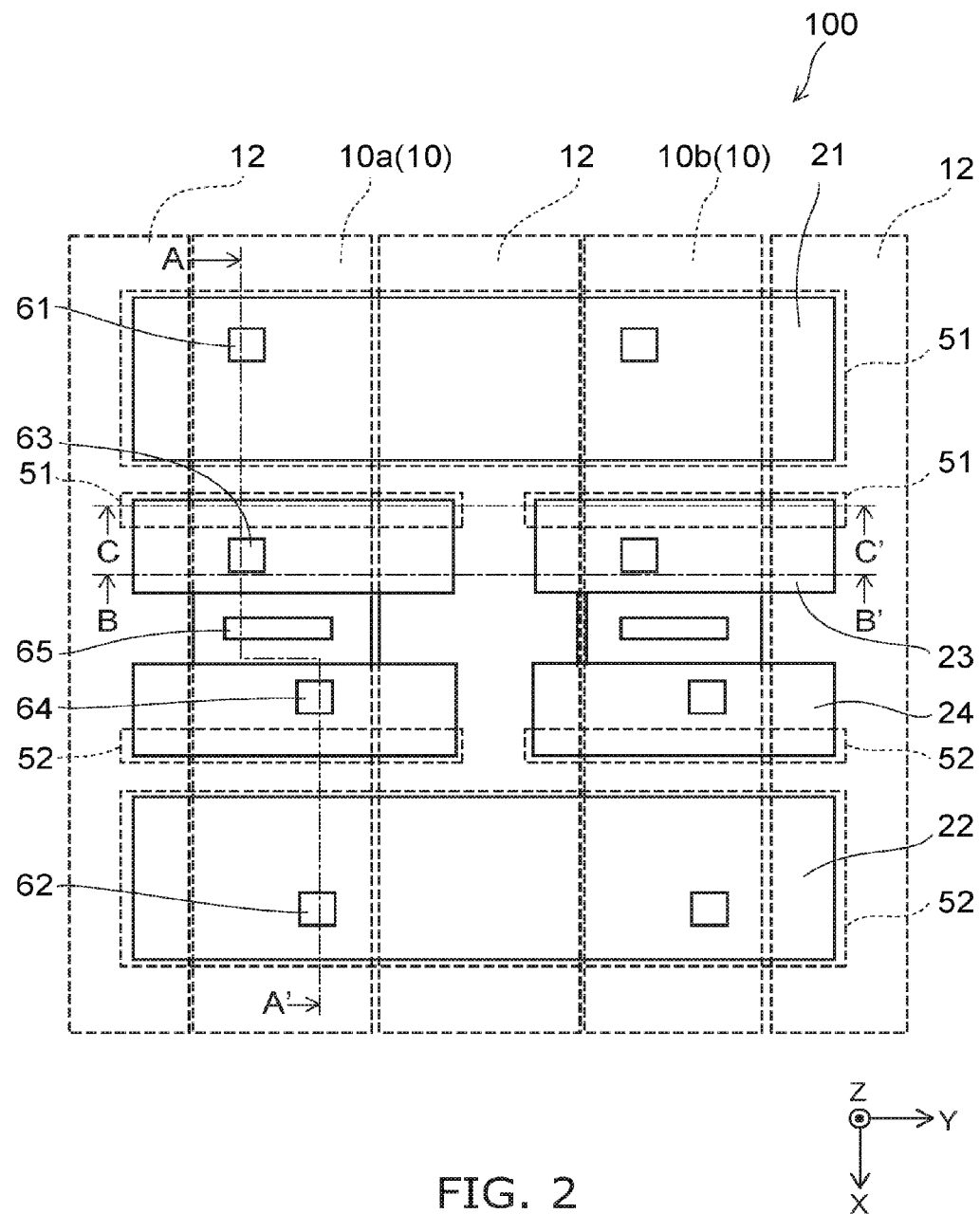
FIG. 2 is a plan view illustrating a semiconductor device according to the first embodiment.

FIG. 2 is a plan view illustrating a semiconductor device according to this embodiment.

Figure 3:
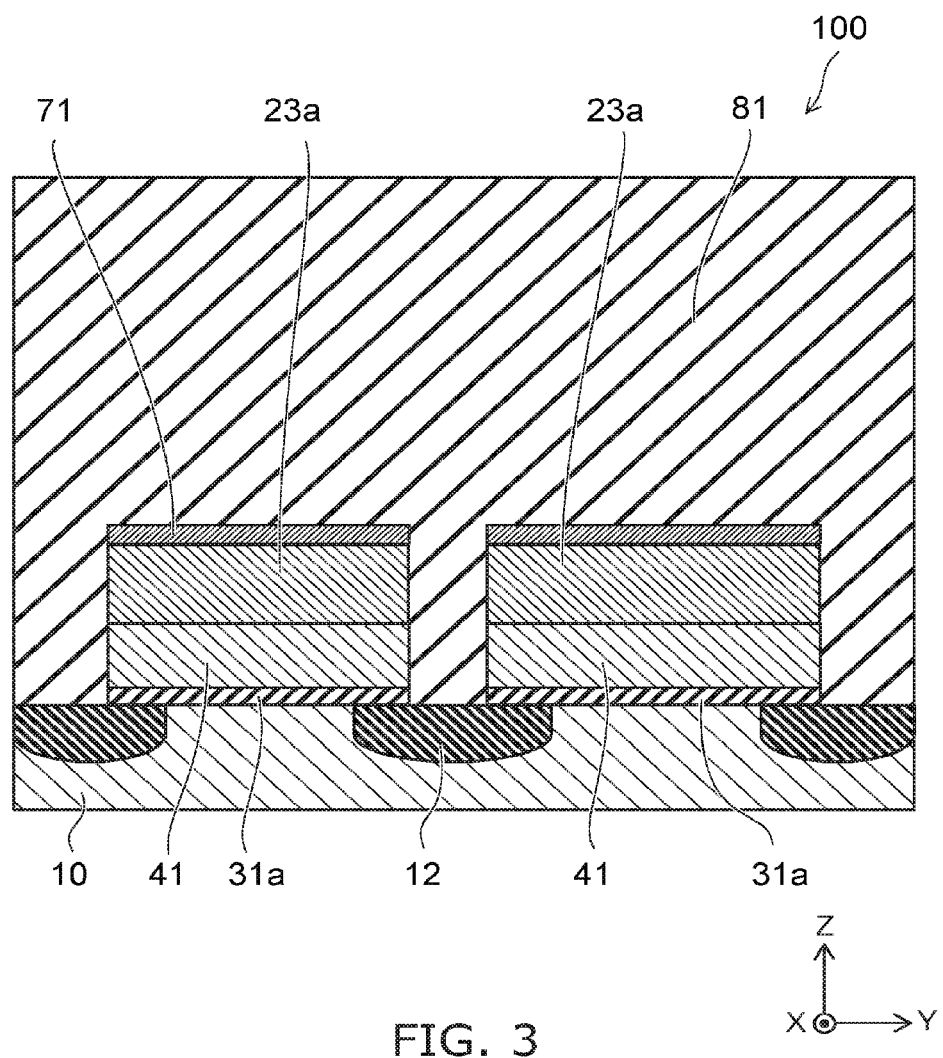
FIGS. 3 and 4 are cross-sectional views illustrating a semiconductor device according to the first embodiment.
Figure 4:
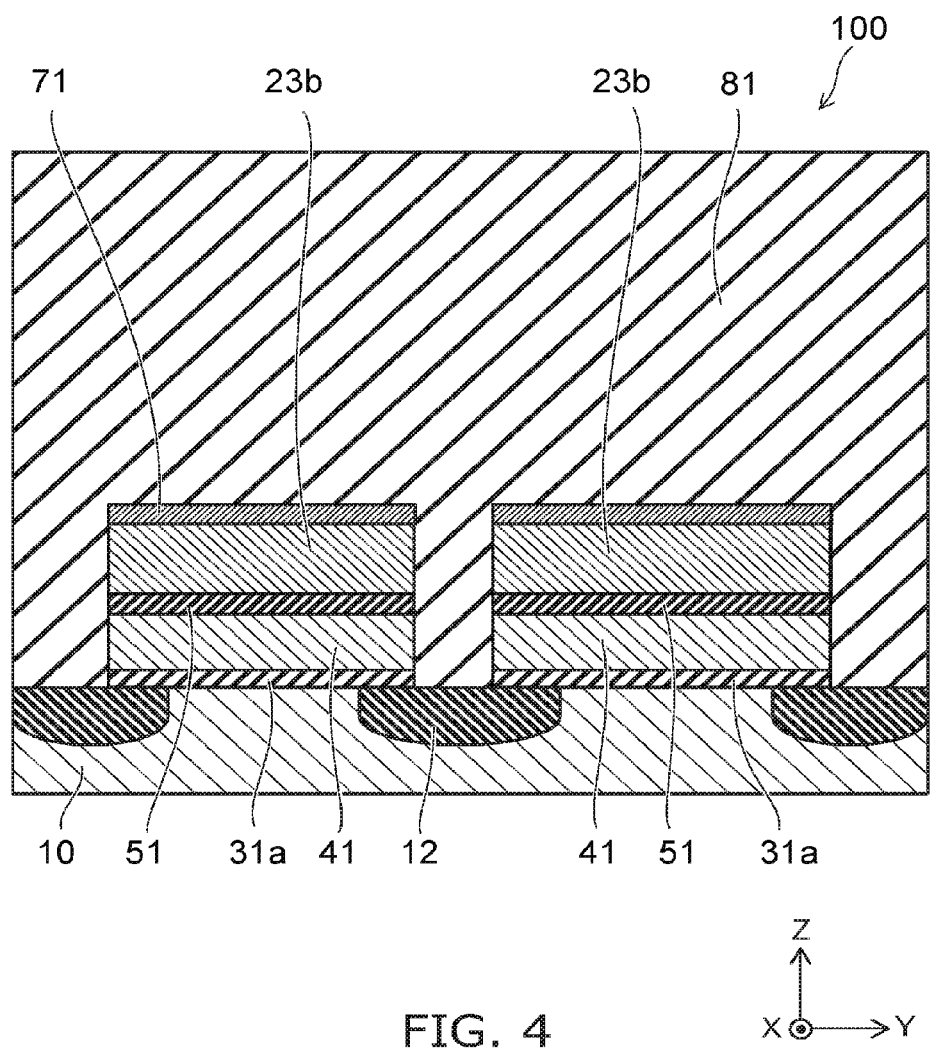

FIGS. 3 and 4 are cross-sectional views illustrating a semiconductor device according to this embodiment.

FIG. 1 is a cross-sectional view along the line A-A' in FIG. 2, FIG. 3 is a cross-sectional view along the line B-B' in FIG. 2, and FIG. 4 is a cross-sectional view along the line C-C' in FIG. 2.

As illustrated in FIG. 1, a semiconductor substrate 10 is provided in the semiconductor device 100 according to this embodiment. The semiconductor substrate 10 contains a p-type impurity such as boron. In the semiconductor substrate 10, the concentration of the p-type impurity down to a depth of 1 μm from the surface is not less than $10^{14}$ cm$^{-3}$ and not more than $5\times10^{16}$ cm$^{-3}$, for example. First to fourth control gate electrode layers 21 to 24 are provided over the semiconductor substrate 10.

The first control gate electrode layer 21 is separated from the semiconductor substrate 10. The direction from the semiconductor substrate 10 toward the first control gate electrode layer 21 is defined as a Z-direction (first direction). One direction orthogonal to the Z-direction is defined as the X-direction (second direction). The direction orthogonal to the Z-direction and the X-direction is defined as the Y-direction (third direction).

The second control gate electrode layer 22 is separated from the first control gate electrode layer 21 in the X-direction.

The third control gate electrode layer 23 is provided between the first control gate electrode layer 21 and the second control gate electrode layer 22. The fourth control gate electrode layer 24 is provided between the second control gate electrode layer 22 and the third control gate electrode layer 23.

The thickness of the first to fourth control gate electrode layers 21 to 24 in the Z-direction is, for example, not less than 10 nm and not more than 100 nm.

The third control gate electrode layer 23 includes a first region 23a and a second region 23b. The first region 23a includes an edge face 23s (first edge face) on the side of the third control gate electrode layer 23 adjacent to the second control gate electrode layer 22. The fourth control gate electrode layer 24 includes a third region 24a and a fourth region 24b. The third region 24a includes an edge face 24s (second edge face) on the side of the fourth control gate electrode layer 24 adjacent to the first control gate electrode layer 21.

A first gate electrode layer 41 is provided between the first control gate electrode layer 21 and the semiconductor substrate 10 and between the third control gate electrode layer 23 and the semiconductor substrate 10. A second gate electrode layer 42 is provided between the second control gate electrode layer 22 and the semiconductor substrate 10 and between the fourth control gate electrode layer 24 and the semiconductor substrate 10. The first gate electrode layer 41 and the second gate electrode layer 42 include a semiconductor material containing an impurity such as phosphorus, arsenic, or boron, for example. The first gate electrode layer 41 includes a semiconductor material containing the impurity at a concentration of not less than $10^{18}$ cm$^{-3}$ and not more than $10^{21}$ cm$^{-3}$, for example. The second gate electrode layer 42 includes a semiconductor material containing an impurity at a concentration of not less than $10^{18}$ cm$^{-3}$ and not more than $10^{21}$ cm$^{-3}$.

A first interlayer insulating film 51 is provided between the first control gate electrode layer 21 and the first gate electrode layer 41 and between the second region 23b of the third control gate electrode layer 23 and the first gate electrode layer 41. A second interlayer insulating film 52 is provided between the second control gate electrode layer 22 and the second gate electrode layer 42 and between the fourth region 24b of the fourth control gate electrode layer 24 and the second gate electrode layer 42. The thickness of the first interlayer insulating film 51 in the Z-direction is, for example, not less than 2 nm and not more than 30 nm. The thickness of the second interlayer insulating film 52 in the Z-direction is, for example, not less than 2 nm and not more than 30 nm.

The first interlayer insulating film 51 and the second interlayer insulating film 52 contain a silicon oxide, for example. The first interlayer insulating film 51 and the second interlayer insulating film 52 may be stacked films including a silicon oxide film, a silicon nitride film, and a silicon oxide film stacked in this order in the Z-direction, for example. The first interlayer insulating film 51 and the second interlayer insulating film 52 may alternatively be stacked films including a silicon oxide film, a silicon nitride film, a silicon oxide film, a silicon oxide film, and a silicon nitride film stacked in this order in the Z-direction, for example. The first interlayer insulating film 51 and the second interlayer insulating film 52 may alternatively be stacked films including a silicon oxide film, an aluminum oxide film, and a silicon oxide film stacked in this order in the Z-direction, for example. The first interlayer insulating film 51 and the second interlayer insulating film 52 may alternatively be stacked films including a silicon oxide film, a hafnium aluminate film, and a silicon oxide film stacked in this order in the Z-direction, for example. The first interlayer insulating film 51 and the second interlayer insulating film 52 may alternatively be stacked films including a silicon oxide film, a hafnium oxide film, and a silicon oxide film stacked in this order in the Z direction, for example.

In the third control gate electrode layer 23, the second region 23b is provided between a portion of the first region 23a and the first control gate electrode layer 21. The first region 23a is provided between the second region 23b and the fourth control gate electrode layer 24 and between the first interlayer insulating film 51 and the second interlayer insulating film 52.

The first region 23a may be provided between the second region 23b and the fourth control gate electrode layer 24, between the first interlayer insulating film 51 and the second interlayer insulating film 52, and between a portion of the first gate electrode layer 41 and a portion of the second gate electrode layer 42.

The first gate electrode layer 41 includes an edge face 41s adjacent to the second gate electrode layer 42. The edge face 41s is formed along a portion of the edge face 23s overlapping the first interlayer insulating film 51 in the X-direction. The edge face 41s is formed along a plane including the portion of the edge face 23s overlapping the first interlayer insulating film 51 in the X-direction. The edge face 41s and the portion of the edge face 23s overlapping the first interlayer insulating film 51 in the X-direction are formed along the Z-direction. The edge face 41s and the edge face 23s are flush with each other in the Z-direction, for example.

In the fourth control gate electrode layer 24, the fourth region 24b is provided between a portion of the third region 24a and the second control gate electrode layer 22. The third region 24a is provided between the fourth region 24b and the third control gate electrode layer 23 and between the second interlayer insulating film 52 and the first interlayer insulating film 51.

The third region 24a may be provided between the fourth region 24b and the third control gate electrode layer 23, between the first interlayer insulating film 51 and the second interlayer insulating film 52, and between a portion of the first gate electrode layer 41 and a portion of the second gate electrode layer 42.

The second gate electrode layer 42 includes an edge face 42s adjacent to the first gate electrode layer 41. The edge face 42s is formed along a portion of the edge face 24s overlapping the second interlayer insulating film 52 in the X-direction. The edge face 42s is formed along a plane including the portion of the edge face 24s overlapping the second interlayer insulating film 52 in the X-direction. The edge face 42s and the portion of the edge face 24s overlapping the second interlayer insulating film 52 in the X-direction are formed along the Z direction. The edge face 42s and the edge face 24s are flush with each other in the Z-direction, for example.

A gate insulating film 31a is provided between the first gate electrode layer 41 and the semiconductor substrate 10. A gate insulating film 31b is provided between the second gate electrode layer 42 and the semiconductor substrate 10. The gate insulating film 31a and the gate insulating film 31b contain a silicon oxide or a silicon oxynitride, for example.

An electrode film 71 is provided on each of the first control gate electrode layer 21, the second control gate electrode layer 22, the third control gate electrode layer 23, and the fourth control gate electrode layer 24. The electrode film 71 is a stacked film including a layer containing tungsten nitride and a layer containing tungsten, for example. In the electrode film 71, the layer containing tungsten is provided on the layer containing tungsten nitride, for example. The thickness of the film containing tungsten nitride in the Z-direction is, for example, not less than 2 nm and not more than 40 nm. The thickness of the film containing tungsten in the Z-direction is, for example, not less than 10 nm and not more than 100 nm.

An insulating layer 81 is provided on the semiconductor substrate 10, on the electrode films 71, between the first control gate electrode layer 21 and the second control gate electrode layer 22, between the first gate electrode layer 41 and the second gate electrode layer 42, between the second control gate electrode layer 22 and the fourth control gate electrode layer 24, and between the fourth control gate electrode layer 24 and the third control gate electrode layer 23.

A first contact plug 61 is provided over the first control gate electrode layer 21. A second contact plug 62 is provided over the second control gate electrode layer 22. A third contact plug 63 is provided over the third control gate electrode layer 23. A fourth contact plug 64 is provided over the fourth control gate electrode layer 24.

The first contact plug 61, the second contact plug 62, the third contact plug 63, and the fourth contact plug 64 extend in the insulating layer 81 in the Z-direction. The first contact plug 61, the second contact plug 62, the third contact plug 63, and the fourth contact plug 64 are formed so as to have a substantially quadrangular prism shape or a substantially cylindrical shape, for example.

The first contact plug 61 is electrically connected to the first control gate electrode layer 21 through the electrode film 71. The second contact plug 62 is electrically connected to the second control gate electrode layer 22 through the electrode film 71. The third contact plug 63 is electrically connected to the third control gate electrode layer 23 through the electrode film 71. The fourth contact plug 64 is electrically connected to the fourth control gate electrode layer 24 through the electrode film 71.

An impurity region 11 is provided on the semiconductor substrate 10 in an area directly below the region between the first gate electrode layer 41 and the second gate electrode layer 42. A fifth contact plug 65 is provided on the impurity region 11. The fifth contact plug 65 extends in the Z-direction in the insulating layer 81. The fifth contact plug 65 has a substantially quadrangular prism shape or substantially elliptic cylindrical shape, for example.

As illustrated in FIGS. 2 to 4, the layers above the semiconductor substrate 10 are separated by element separation films 12. In FIG. 2, for ease of explanation, one region of the semiconductor substrate 10 separated by the element separation film 12 is defined as a first active element region 10a, and the other region is defined as a second active element region 10b.

As illustrated in FIG. 2, the first control gate electrode layer 21 and the second control gate electrode layer 22 are disposed on the first active element region 10a, the second active element region 10b, and the element separation film 12 disposed between the first active element region 10a and the second active element region 10b. In other words, the first control gate electrode layer 21 overlaps a portion of the first active element region 10a, a portion of the second active element region 10b, and a portion of the element separation film 12 in the Z-direction. The second control gate electrode layer 22 overlaps a portion of the first active element region 10a, a portion of the second active element region 10b, and a portion of the element separation film 12 in the Z-direction.

A plurality of the third control gate electrode layers 23 are separated from each other in the Y-direction, for example. Each of the third control gate electrode layers 23 is provided on the first active element region 10a and the second active element region 10b. A portion of one of the third control gate electrode layers 23 overlaps a portion of the first active element region 10a or a portion of the second active element region 10b, in the Z-direction. Also, portions of the third control gate electrode layer 23 overlap a portion of the element separation film 12 in the Z-direction.

A plurality of the fourth control gate electrode layers 24 are separated from each other in the Y-direction, for example. Each of the fourth control gate electrode layers 24 is provided on the first active element region 10a and the second active element region 10b. A portion of one of the fourth control gate electrode layers 24 overlaps a portion of the first active element region 10a or a portion of the second active element region 10b, in the Z-direction. Also, portions of the fourth control gate electrode layer 24 overlap a portion of the element separation film 12 in the Z-direction.

As illustrated in FIG. 3, the interlayer insulating film 51 is not present between the first region 23a of third control gate electrode layer 23 and the first gate electrode layer 41. However, as illustrated in FIG. 4, the interlayer insulating film 51 is present between the second region 23b and the first gate electrode layer 41.

In the semiconductor device 100 illustrated in FIG. 1, the third control gate electrode layer 23, the first gate electrode layer 41, the gate insulating film 31a, and the semiconductor substrate 10 function as a capacitative element, for example. The first control gate electrode layer 21, the first interlayer insulating film 51, the first gate electrode layer 41, the gate insulating film 31a, and the semiconductor substrate 10 function as a capacitative element. The fourth control gate electrode layer 24, the second gate electrode layer 42, the gate insulating film 31b, and the semiconductor substrate 10 function as a capacitative element. The second control gate electrode layer 22, the second interlayer insulating film 52, the second gate electrode layer 42, the gate insulating film 31b, and the semiconductor substrate 10 function as a capacitative element.

Next, a manufacturing method for the semiconductor device according to this embodiment will be described.

FIGS. 5 to 10 are process cross-sectional views illustrating a method for manufacturing the semiconductor device according to this embodiment. FIGS. 5 to 10 are cross-sectional views illustrating cross-sections corresponding to the cross-section along the line A-A' illustrated in FIG. 2.

Figure 5:
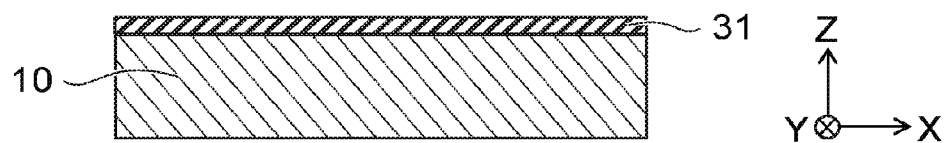
FIGS. 5 to 10 are process cross-sectional views illustrating a method for manufacturing the semiconductor device according to the first embodiment.

As illustrated in FIG. 5, the semiconductor substrate 10 including an impurity such as boron is prepared. In the semiconductor substrate 10, the concentration of the p-type impurity down to a depth of 1 pm from the surface is not less than $10^{14}$ cm$^{-3}$ and not more than $5\times10^{16}$ cm$^{-3}$, for example.

Next, the gate insulating film 31 is formed on the semiconductor substrate 10. The gate insulating film 31 is formed of a material containing a silicon oxide or silicon oxynitride.

Figure 6:
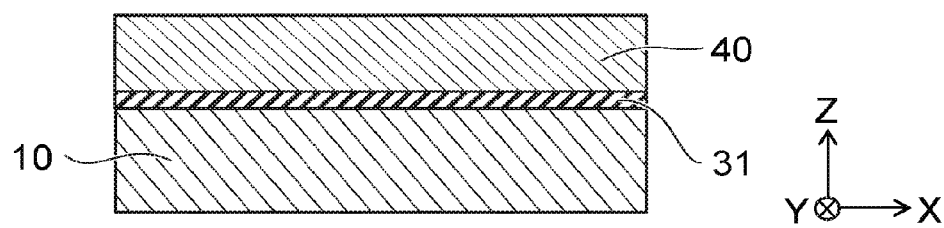

As illustrated in FIG. 6, a gate electrode layer 40 is formed over the semiconductor substrate 10 with the gate insulating film 31 placed between the gate electrode layer 40 and the semiconductor substrate 10. The gate electrode layer 40 is formed of a semiconductor material containing an impurity such as phosphorus, arsenic, or boron, for example. The gate electrode layer 40 is formed of polycrystalline silicon containing the impurity at a concentration of not less than $10^{18}$ cm$^{-3}$ and not more than $10^{21}$ cm$^{-3}$, for example.

Figure 7:
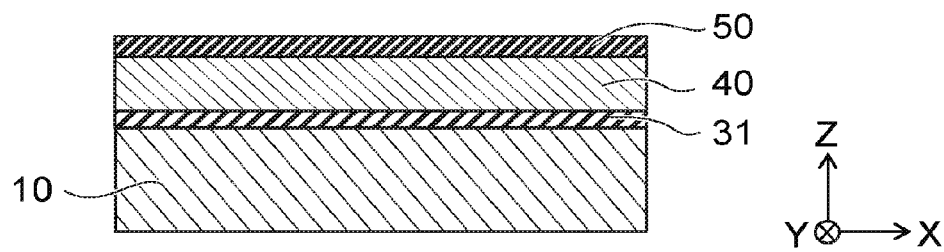

As illustrated in FIG. 7, the interlayer insulating film 50 is formed on the gate electrode layer 40. The interlayer insulating film 50 is formed of a material containing silicon oxide, for example. The interlayer insulating film 50 may be formed by stacking a silicon oxide film, a silicon nitride film, and a silicon oxide film in that order, for example. Alternatively, the interlayer insulating film 50 may be formed by stacking a silicon oxide film, a silicon nitride film, a silicon oxide film, a silicon oxide film, and a silicon nitride film in that order, for example. The interlayer insulating film 50 may be formed by stacking a silicon oxide film, an aluminum oxide film, and a silicon oxide film in that order, for example. The interlayer insulating film 50 may be formed by stacking a silicon oxide film, a hafnium aluminate film, and a silicon oxide film in that order, for example. The interlayer insulating film 50 may be formed by stacking a silicon oxide film, a hafnium oxide film, and a silicon oxide film in that order, for example. The thickness of the interlayer insulating film 50 may be not less than 2 nm and not more than 30 nm, for example.

Figure 8:
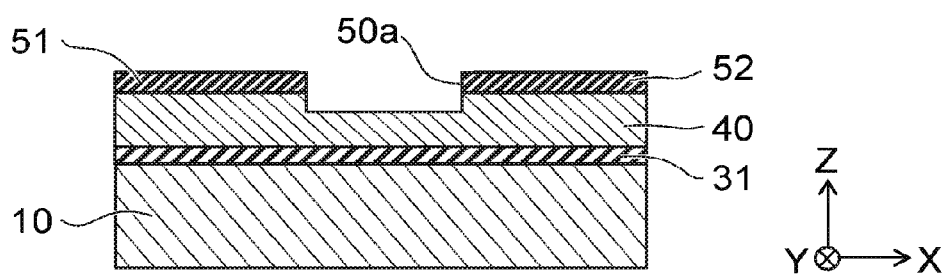

As illustrated in FIG. 8, a groove 50a (fourth groove) is formed in the interlayer insulating film 50. The groove 50a extends in the Y direction on the gate electrode layer 40. A portion of the upper surface of the gate electrode layer 40 is exposed at the bottom of the groove 50a. The groove 50a separates the interlayer insulating film 50 into the first interlayer insulating film 51 and the second interlayer insulating film 52.

Figure 9:
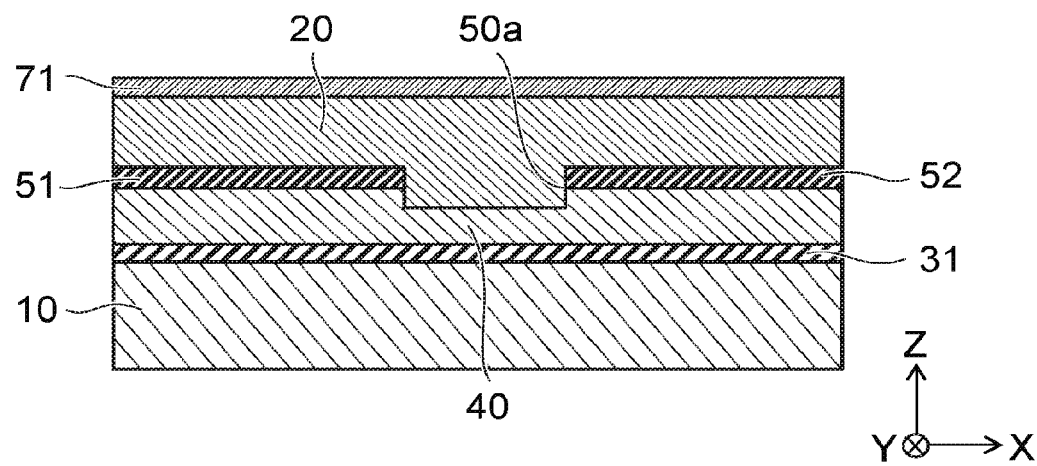

As illustrated in FIG. 9, a control gate electrode layer 20 is formed on the first interlayer insulating film 51, on the second interlayer insulating film 52, and in the groove 50a. The control gate electrode layer 20 is formed of a material containing polysilicon, for example. The thickness of the control gate electrode layer 20 may be not less than 10 nm and not more than 100 nm, for example.

An electrode film 71 is formed on the control gate electrode layer 20. The electrode film 71 is formed by stacking a film containing tungsten nitride and a film containing tungsten in this order. The thickness of the film containing tungsten nitride is not less than 2 nm and not more than 40 nm, for example. The thickness of the film containing tungsten is not less than 10 nm and not more than 100 nm, for example.

Figure 10:
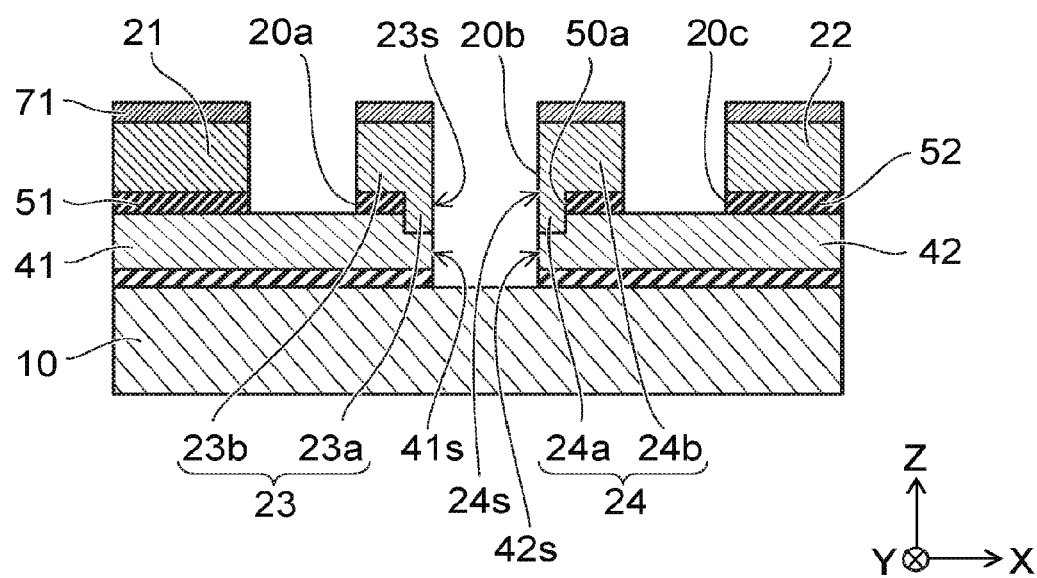

As illustrated in FIG. 10, a groove 20a (first groove) is formed through a portion of the first interlayer insulating film 51. A groove 20b (second groove) is formed in the groove 50a, and a groove 20c (third groove) is formed through a portion of the second interlayer insulating film 52. The groove 20a, the groove 20b, and the groove 20c may all be formed simultaneously.

The groove 20a separates the control gate electrode layer 20 into the first control gate electrode layer 21 and the third control gate electrode layer 23. The groove 20b separates the control gate electrode layer 20 into the third control gate electrode layer 23 and the fourth control gate electrode layer 24, and separates the gate electrode layer 40 into the first gate electrode layer 41 and the second gate electrode layer 42. The groove 20c separates the control gate electrode layer 20 into the third control gate electrode layer 23 and the second control gate electrode layer 22.

The first control gate electrode layer 21, the third control gate electrode layer 23, the fourth control gate electrode layer 24, and the second control gate electrode layer 22 are arranged in this order so as to be separated from each other in the X-direction.

The third control gate electrode layer 23 includes the first region 23a and the second region 23b. The first region 23a includes the edge face 23s on the side of the third control gate electrode layer 23 adjacent to the second control gate electrode layer 22. The formed fourth control gate electrode layer 24 includes the third region 24a and the fourth region 24b. The third region 24a includes the edge face 24s on the side of the fourth control gate electrode layer 24 adjacent to the first control gate electrode layer 21.

The first gate electrode layer 41 includes the edge face 41s adjacent to the second gate electrode layer 42. The second gate electrode layer 42 includes the edge face 42s adjacent to the first gate electrode layer 41.

The groove 20b overlaps a portion of the groove 50a in the Z-direction. In the groove 20b, the edge face 23s of the first region 23a and the edge face 41s of the first gate electrode layer 41 are formed along the Z-direction. The edge face 23s and the edge face 41s are flush with each other in the Z-direction in the groove 20b, for example. The edge face 24s of the third region 24a and the edge face 42s of the second gate electrode layer 42 are formed along the Z-direction. The edge face 24s and the edge face 42s are flush with each other in the Z-direction in the groove 20b, for example.

As illustrated in FIG. 1, impurity ions to be donors are implanted on the semiconductor substrate 10 in an area directly below the region between the first gate electrode layer 41 and the second gate electrode layer 42. In this manner, the impurity region 11 is formed on the semiconductor substrate 10.

The insulating layer 81 is formed on the semiconductor substrate 10, on the electrode films 71, on the impurity region 11, between the first control gate electrode layer 21 and the third control gate electrode layer 23, and between the fourth control gate electrode layer 24 and the second control gate electrode layer 22.

The first to fifth contact plugs 61 to 65, which extend in the Z-direction, are formed in the insulating layer 81.

The first contact plug 61 is formed over the first control gate electrode layer 21. The first contact plug 61 is electrically connected to the first control gate electrode layer 21 through the electrode film 71. The second contact plug 62 is formed over the second control gate electrode layer 22. The second contact plug 62 is electrically connected to the second control gate electrode layer 22 through the electrode film 71. The third contact plug 63 is formed over the third control gate electrode layer 23. The third contact plug 63 is electrically connected to the third control gate electrode layer 23 through the electrode film 71. The fourth contact plug 64 is formed over the fourth control gate electrode layer 24. The fourth contact plug 64 is electrically connected to the fourth control gate electrode layer 24 through the electrode film 71. The fifth contact plug 65 is formed on the impurity region 11. The fifth contact plug is electrically connected to the impurity region 11.

In this manner, the semiconductor device 100 according to this embodiment is manufactured.

The following is a description of an example of a semiconductor memory device 150 including the semiconductor device 100 according to this embodiment.

Figure 11:
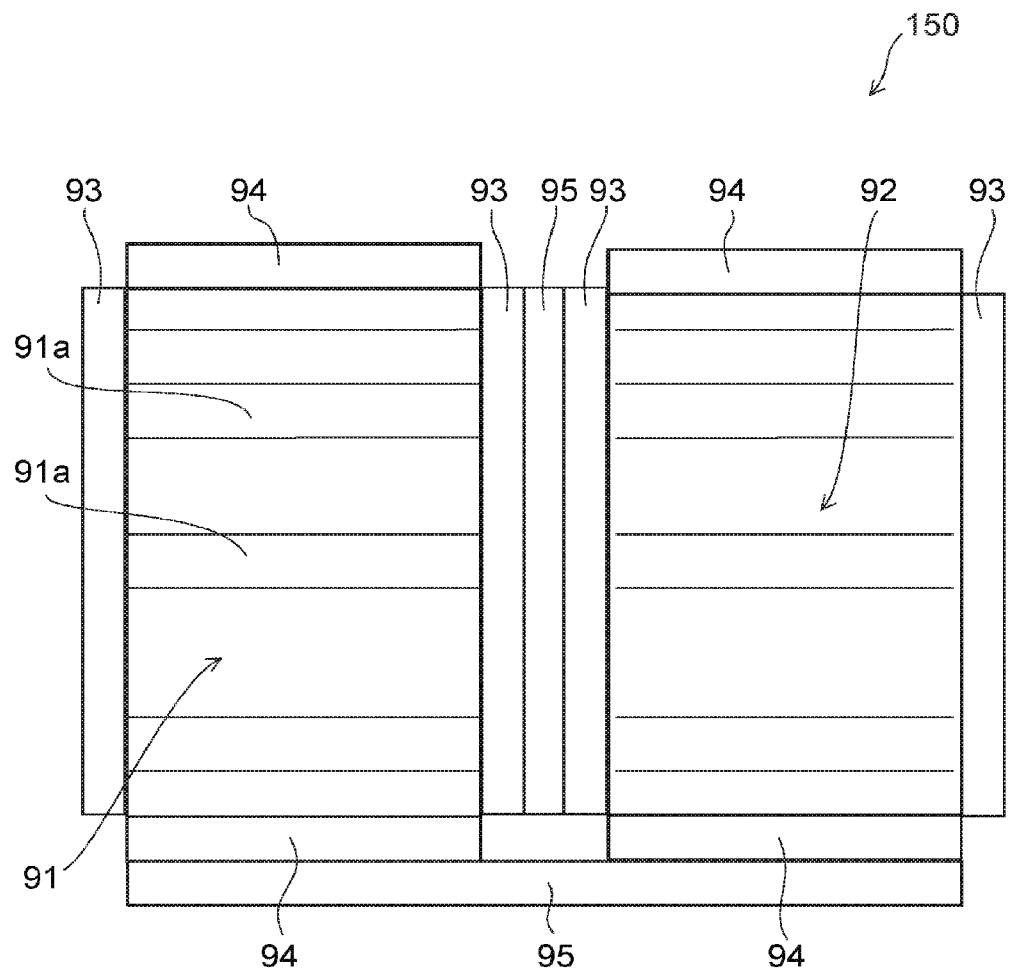
FIG. 11 is a plan view illustrating a semiconductor memory device including a semiconductor device according to the first embodiment.

FIG. 11 is a plan view illustrating a semiconductor memory device including a semiconductor device according to this embodiment.

Figure 12:
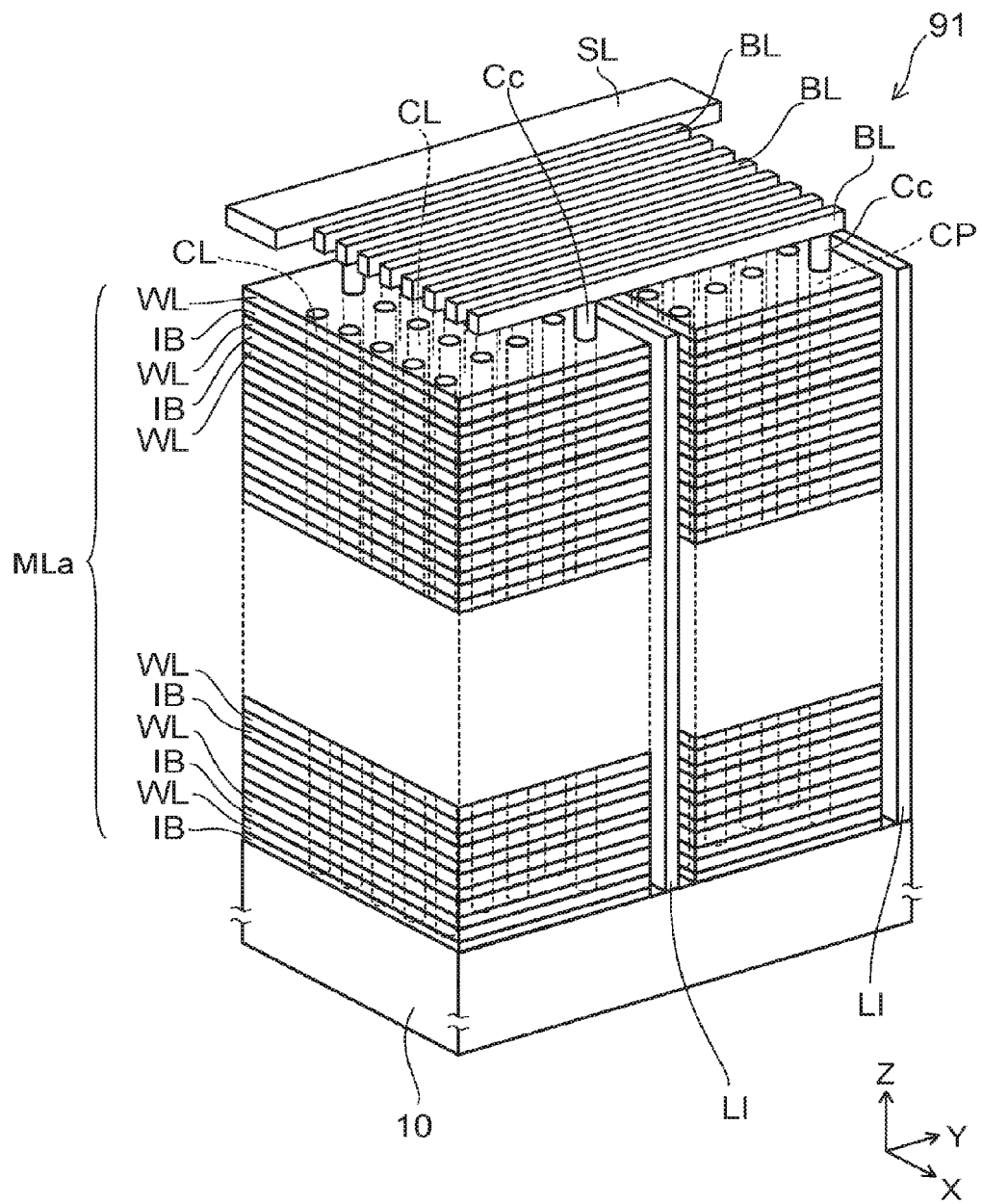
FIG. 12 is a perspective view illustrating a portion of a memory cell region of the semiconductor memory device including the semiconductor device according to the first embodiment.

FIG. 12 is a perspective view illustrating a portion of a memory cell region of the semiconductor memory device including the semiconductor device according to this embodiment.

Figure 13:
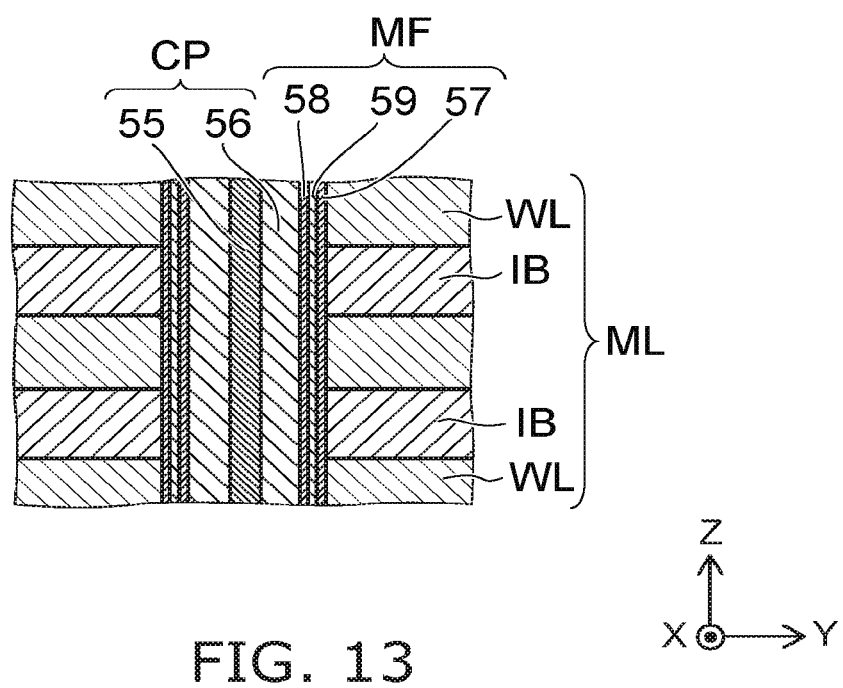
FIG. 13 is a cross-sectional view illustrating a periphery of a semiconductor pillar.

FIG. 13 is a cross-sectional view illustrating a periphery of a semiconductor pillar.

As illustrated in FIG. 11, the semiconductor memory device 150 is provided with memory cell regions 91 and 92. A plurality of memory cells 91a are provided in the memory cell regions 91 and 92. The memory cells 91a drive circuits according to signals from outside, and are connected to row decoders 93 that write or delete data, for example. The memory cell 91a is electrically connected to the semiconductor device 100 provided in a sense amplifier region 94 through a bit line, for example. A peripheral circuit region 95 (peripheral circuit part) is provided on the periphery of the memory cell region 91. The peripheral circuit region 95 is provided with a logic circuit and a control circuit. The peripheral circuit region 95 may be provided with the semiconductor device 100 as a capacitative element, for example.

As illustrated in FIG. 12, a stacked body ML including a plurality of conductive layers WL is provided on the semiconductor substrate 10 in the memory cell region 91 of the semiconductor memory device 150. The plurality of conductive layers WL are separated from each other in the Z-direction. In the stacked body ML, the plurality of conductive layers WL are arranged in the Z-direction with an insulator between the adjacent conductive layers WL. The insulators are insulating layers IB containing a silicon oxide, for example.

Semiconductor pillars CP and source members LI are provided on the semiconductor substrate 10. The semiconductor pillars CP extend in the Z-direction inside the stacked body ML. The semiconductor pillars CP are electrically connected to the semiconductor substrate 10. The source member LI has a plate shape extending in the X-direction and the Z-direction in the stacked body ML, for example. The source member LI is electrically connected to the semiconductor substrate 10. A source line SL and bit lines BL are provided on the stacked body ML. The source line SL and the bit lines BL extend in the Y-direction, for example. The semiconductor pillars CP and the bit lines BL are electrically connected to each other through plugs Cc. The source member LI is electrically connected to the source line SL. The bit line BL is electrically connected to the semiconductor device 100 provided in the sense amplifier region 94 illustrated in FIG. 11, for example.

In FIG. 12, insulating members other than the insulating layers IB are not illustrated. The configuration of the memory cell region 91 illustrated in FIG. 12 is one example, and the configuration is not limited thereto.

The method for manufacturing the semiconductor device 100 according to this embodiment may include a process for manufacturing the memory cell region 91 (memory part) described above. The method for manufacturing the semiconductor device 100 may include a process for manufacturing the peripheral circuit region 95 (peripheral circuit part) described above.

As illustrated in FIG. 13, the semiconductor pillar CP includes an insulating member 55 and a semiconductor film 56 extending in the Z-direction. The semiconductor film 56 is provided between the insulating member 55 and the stacked body ML.

A memory film MF is provided between the semiconductor pillar CP and the stacked body ML. The memory film MF includes a block insulating film 57, a tunnel insulating film 58, and a charge storage film 59. The block insulating film 57 is provided between the semiconductor pillar CP and the conductive layer WL. The tunnel insulating film 58 is provided between the semiconductor pillar CP and the block insulating film 57. The charge storage film 59 is provided between the block insulating film 57 and the tunnel insulating film 58.

The block insulating film 57 and the tunnel insulating film 58 contain a silicon oxide, for example. The block insulating film 57 and the tunnel insulating film 58 may contain at least one of $Al_2O_3$, $Y_2O_3$, $La_2O_3$, $Gd_2O_3$, $Ce_2O_3$, $CeO_2$, $Ta_2O_5$, $HfO_2$, $ZrO_2$, $TiO_2$, HfSiO, HfAlO, ZrSiO, ZrAlO, and AlSiO, for example.

The charge storage film 59 contains a silicon nitride, for example.

In this embodiment, as illustrated in FIGS. 8 to 10, the groove 50a is formed in the interlayer insulating film 52. Then, the control gate electrode layer 20 is formed on the interlayer insulating film 52. When separating the control gate electrode layer 20 into the first to third control gate electrode layers 21 to 24, the groove 20b is formed so as to overlap a portion of the groove 50a in the Z-direction. This makes it possible to simultaneously process the control gate electrode layer 20 and the gate electrode layer 40.

A reference example will be described.

Figure 14:
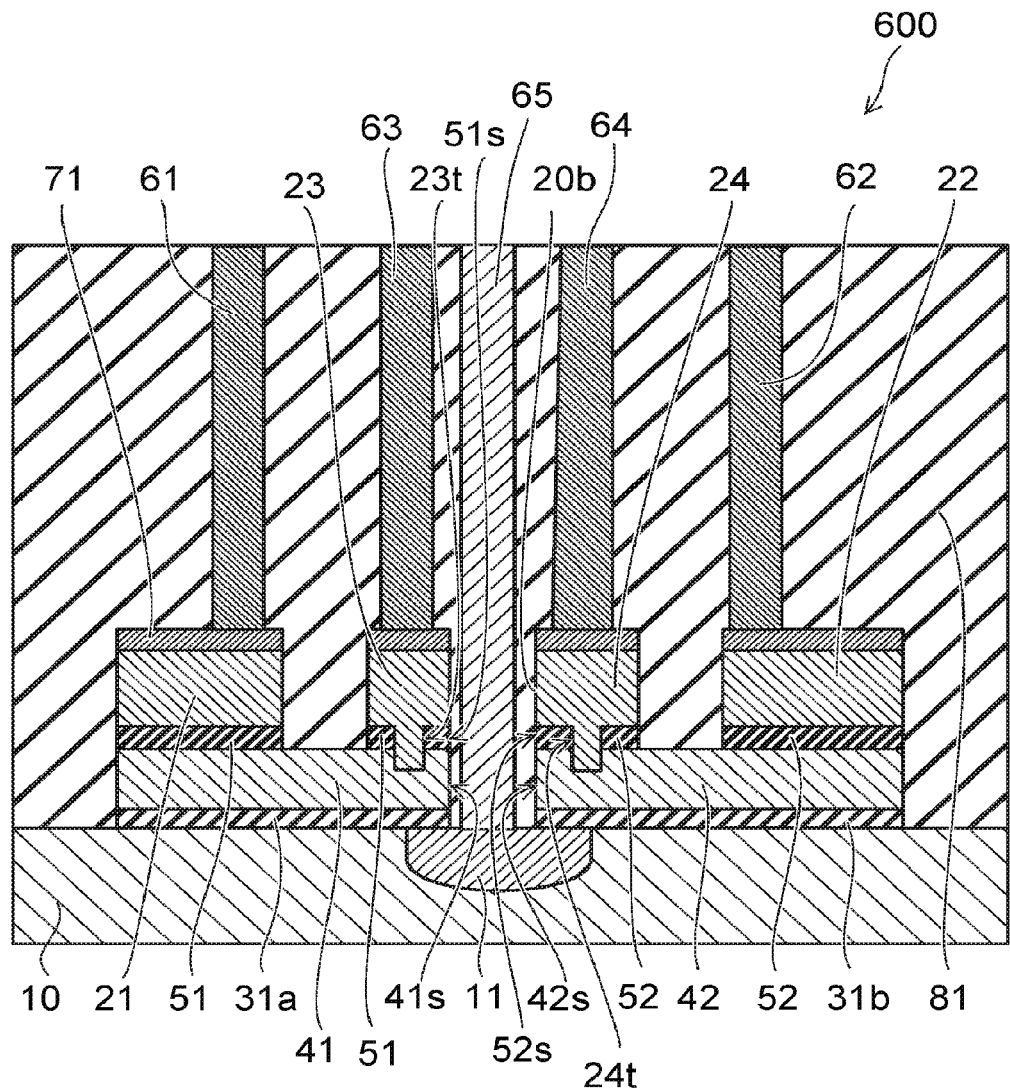
FIG. 14 is a cross-sectional view illustrating a semiconductor device according to a reference example.

FIG. 14 is a cross-sectional view illustrating a semiconductor device according to the reference example. FIG. 14 is a cross-sectional view illustrating a cross-section corresponding to the cross-section along the line A-A' illustrated in FIG. 2.

As illustrated in FIG. 14, a first interlayer insulating film 51 includes an edge face 51s adjacent to a second control gate electrode layer 22 in a semiconductor device 600 according to the reference example. The edge face 51s is disposed between an edge face of a third control gate electrode layer 23 adjacent to a second control gate electrode and an edge face 41s of a first gate electrode layer 41. Thus, in the Z-direction, the edge face of the third control gate electrode layer 23 adjacent to the second control gate electrode is not flush with the edge face 41s.

In the X-direction, the third control gate electrode layer 23 has an edge face 23t adjacent to the second control gate electrode layer 22 in a portion of the third control gate electrode layer 23 overlapping the first interlayer insulating film 51. The edge face 23t and the edge face 41s are not flush with each other in the Z-direction.

The second interlayer insulating film 52 includes an edge face 52s adjacent to the first control gate electrode layer 21. An edge face 52s is disposed between an edge face of a fourth control gate electrode layer 24 adjacent to the first control gate electrode and the edge face 42s of the second gate electrode layer 42. Thus, in the Z-direction, the edge face of the fourth control gate electrode layer 24 adjacent to the second control gate electrode is not flush with the edge face 42s. In the X-direction, the fourth control gate electrode layer 24 has an edge face 24t adjacent to the first control gate electrode layer 21 in a portion of the fourth control gate electrode layer 24 overlapping the second interlayer insulating film 52. The edge face 24t and the edge face 42s are not flush with each other in the Z-direction.

A portion of the first region 23a, which extends in the first interlayer insulating film 51 in the Z-direction, is electrically connected to the second gate electrode layer 41. A portion of the third region 24a, which extends in the second interlayer insulating film 52 in the Z-direction, is electrically connected to the second gate electrode layer 42.

The configuration is otherwise similar to the semiconductor device 100.

Next, a method for manufacturing the semiconductor device 600 according to the reference example will be described.

FIGS. 15 to 18 are process cross-sectional views illustrating the method for manufacturing the semiconductor device 600 according to the reference example.

FIGS. 15 to 18 are cross-sectional views illustrating cross-sections corresponding to the cross-section along the line A-A' illustrated in FIG. 2.

Similar to the first embodiment, the processes illustrated in FIGS. 5 to 7 are performed.

Figure 15:
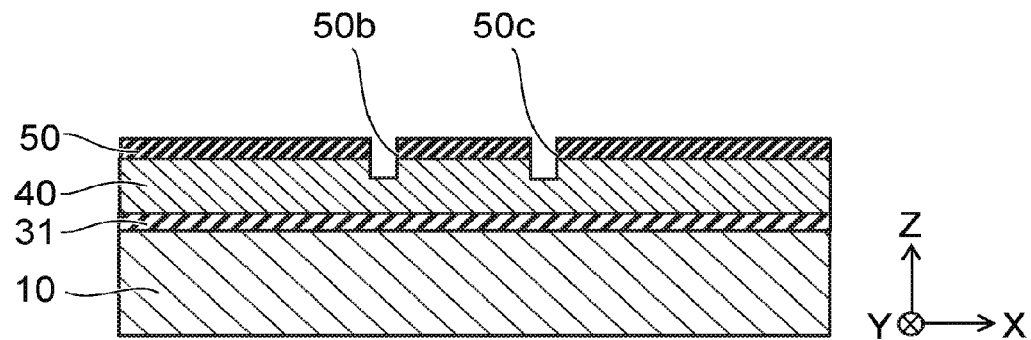
FIGS. 15 to 18 are process cross-sectional views illustrating the method for manufacturing the semiconductor device according to the reference example.
Figure 16:
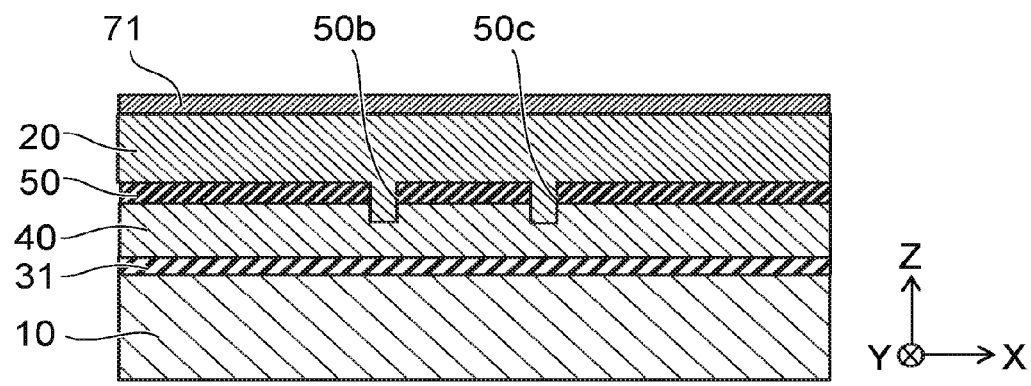

As illustrated in FIG. 15, grooves 50b and 50c are formed in the interlayer insulating film 50. A portion of the upper surface of the gate electrode layer 40 is exposed at the bottom of the grooves 50b and 50c. As illustrated in FIG. 16, the control gate electrode layer 20 is formed on the interlayer insulating film 52, and in the groove 50b and the groove 50c. An electrode film 71 is formed on the control gate electrode layer 20.

Figure 17:
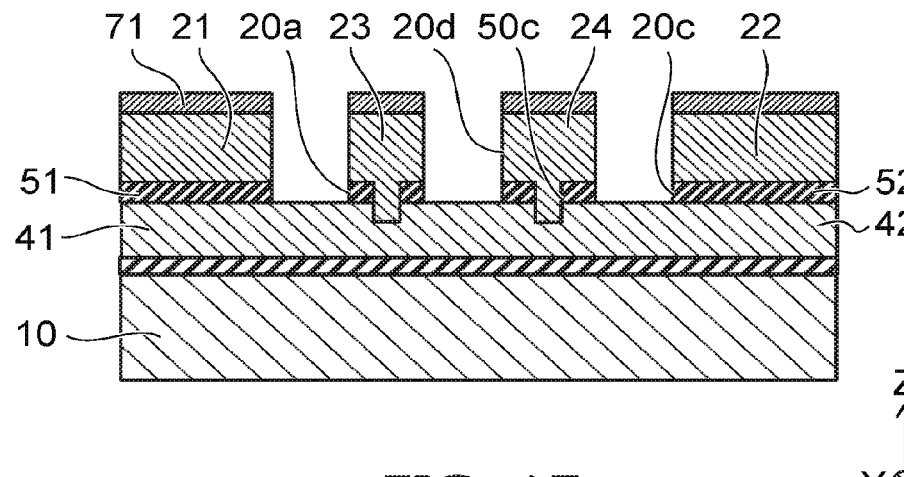
Figure 18:
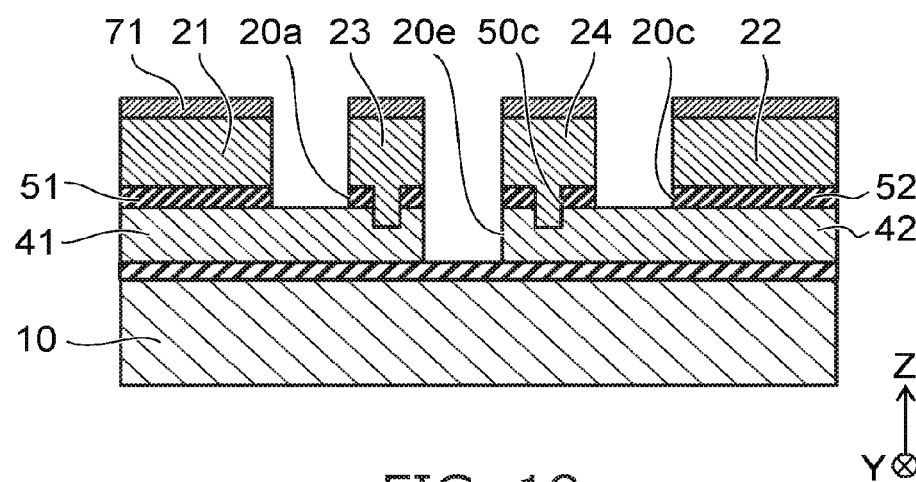

As illustrated in FIG. 17, the groove 20a, the groove 20d, and the groove 20c are formed by anisotropic etching such as reactive-ion etching (RIE). The groove 20a separates the control gate electrode layer 20 into the first control gate electrode layer 21 and the third control gate electrode layer 23. The groove 20d separates the control gate electrode layer 20 into the third control gate electrode layer 23 and the fourth control gate electrode layer 24. The groove 20c separates the control gate electrode layer 20 into the fourth control gate electrode layer 24 and the second control gate electrode layer 22.

The groove 20d is formed on the interlayer insulating film 50 and between the groove 20a and the groove 20c. The groove 20d does not communicate with the groove 20a. The groove 20d does not communicate with the groove 20c. During etching to form the groove 20d, the interlayer insulating film 50 functions as an etching stopper. As a result, the groove 20d does not separate the gate electrode layer 40.

The interlayer insulating film 50 inside the groove 20d and a portion of the gate electrode layer 40 directly below this interlayer insulating film 50 are removed by etching. This forms the groove 20e. The groove 20e separates the interlayer insulating film 50 into the first interlayer insulating film 51 and the second interlayer insulating film 52. The groove 20e separates the gate electrode layer 40 into the first gate electrode layer 41 and the second gate electrode layer 42.

Then, through a similar process to the first embodiment, the semiconductor device 600 illustrated in FIG. 14 is manufactured.

In the method for manufacturing the semiconductor device 600 according to the reference example, after forming the groove 20d, an etching process is further performed through the groove 20d to form the groove 20e. In other words, the groove separating the control gate electrode layer and the groove separating the gate electrode layer are formed in different processes.

In the first embodiment, the grooves 20a, 20b, and 20c are formed simultaneously. In other words, the groove separating the control gate electrode layer and the groove separating the gate electrode layer can be formed simultaneously. Thus, it is possible to reduce the number of manufacturing processes in the first embodiment. In the first embodiment, it is possible to set the distance between the first control gate electrode layer 21 and the third control gate electrode layer 23 and between the fourth control gate electrode layer 24 and the second control gate electrode layer 22 to be shorter than the distance between the first control gate electrode layer 21 and the third control gate electrode layer 23 and between the fourth control gate electrode layer 24 and the second control gate electrode layer 22 in the semiconductor device 600. Thus, it is possible to reduce the size of the semiconductor device.

A comparative example of the first embodiment will be described.

Figure 19:
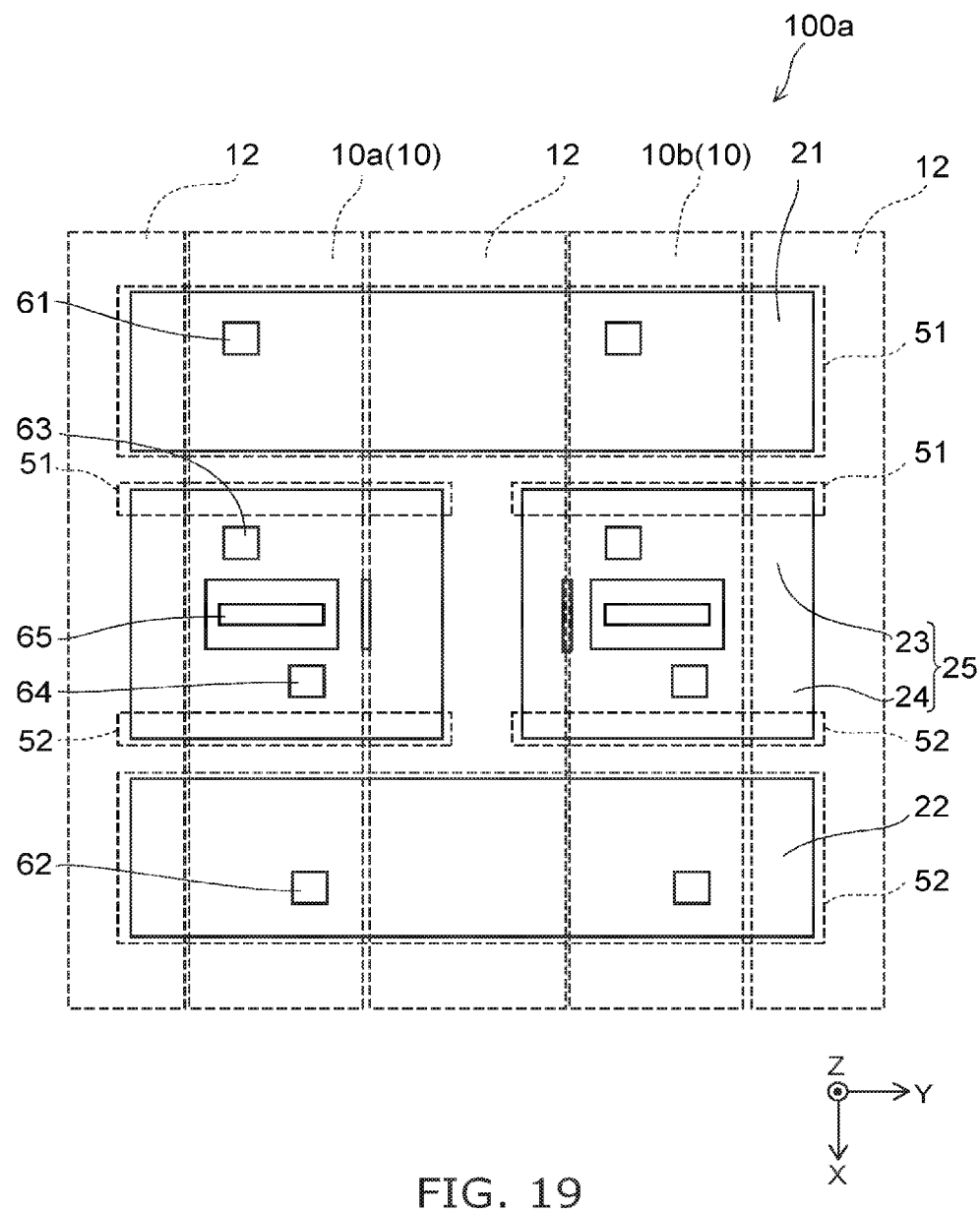
FIG. 19 is a plan view of a semiconductor device according to according to a comparative example of the first embodiment.

FIG. 19 is a plan view of a semiconductor device according to this comparative example.

As illustrated in FIG. 19, a fifth control gate electrode layer 25 is provided between the first control gate electrode layer 21 and the second control gate electrode layer 22. The fifth control gate electrode 25 contains a portion corresponding to the third control gate electrode layer 23 in the semiconductor device 100 and a portion corresponding to the fourth control gate electrode layer 24 in the semiconductor device 100. The portion corresponding to the third control gate electrode layer 23 and the portion corresponding to the fourth control gate electrode layer 24 are combined into one body.

The fifth control gate electrode layer 25 has a hole HL. The fifth contact plug 65 is electrically connected with the impurity region 11 through the hole HL. The first gate electrode layer 41 and the second gate electrode layer 42 may be combined into one body under the fifth control gate electrode layer 25.

A manufacturing method of this comparative example will be described.

A hole HL is formed penetrating the gate electrode layer 20 and the control gate electrode layer 40. The control gate electrode layer 20

Then, through a similar process to the first embodiment, the semiconductor device 100a is manufactured.

A second embodiment will be described.

Figure 20:
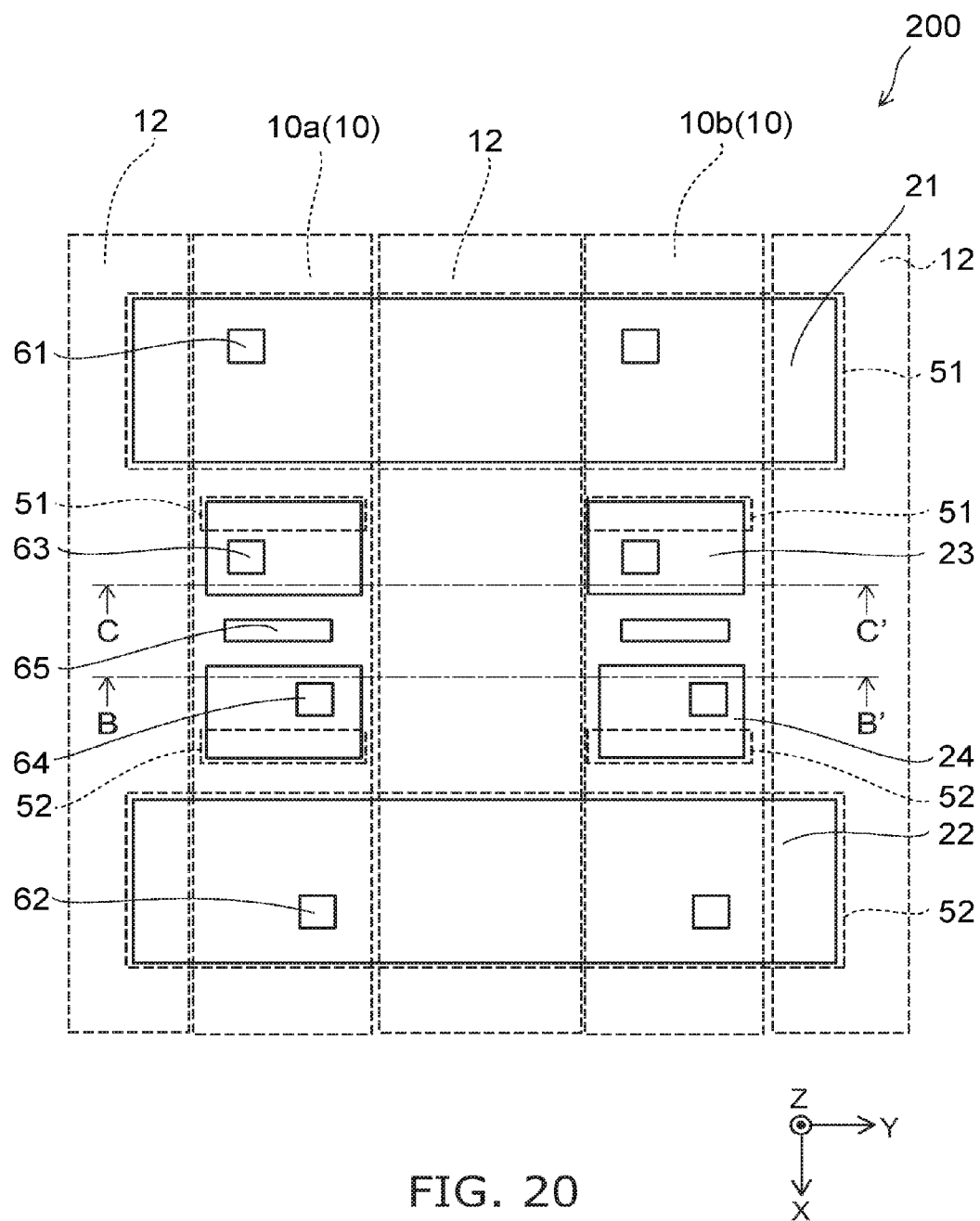
FIG. 20 is a plan view of a semiconductor device according to a second embodiment.

FIG. 20 is a plan view of a semiconductor device according to this embodiment.

Figure 21:
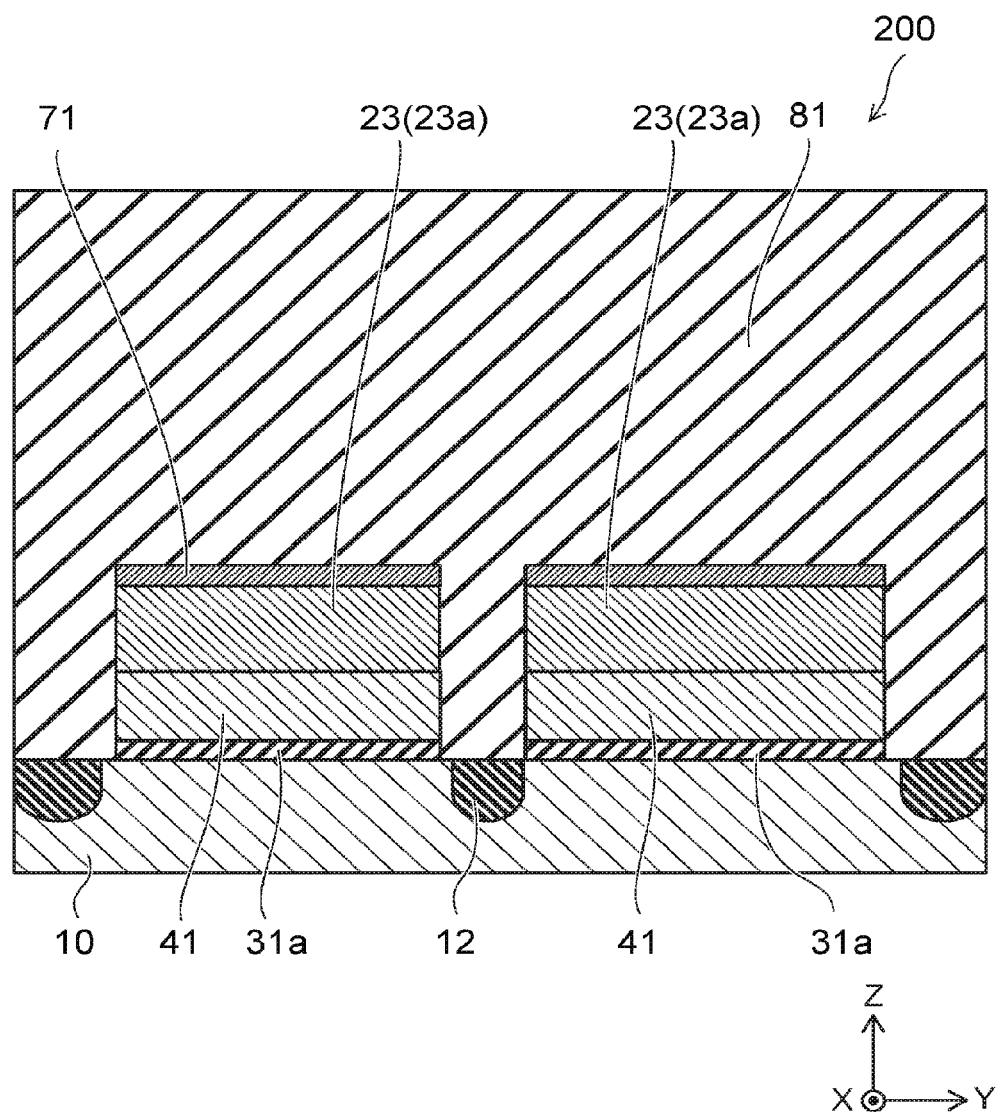
FIGS. 21 and 22 are cross-sectional views of the semiconductor device according to the second embodiment.
Figure 22:
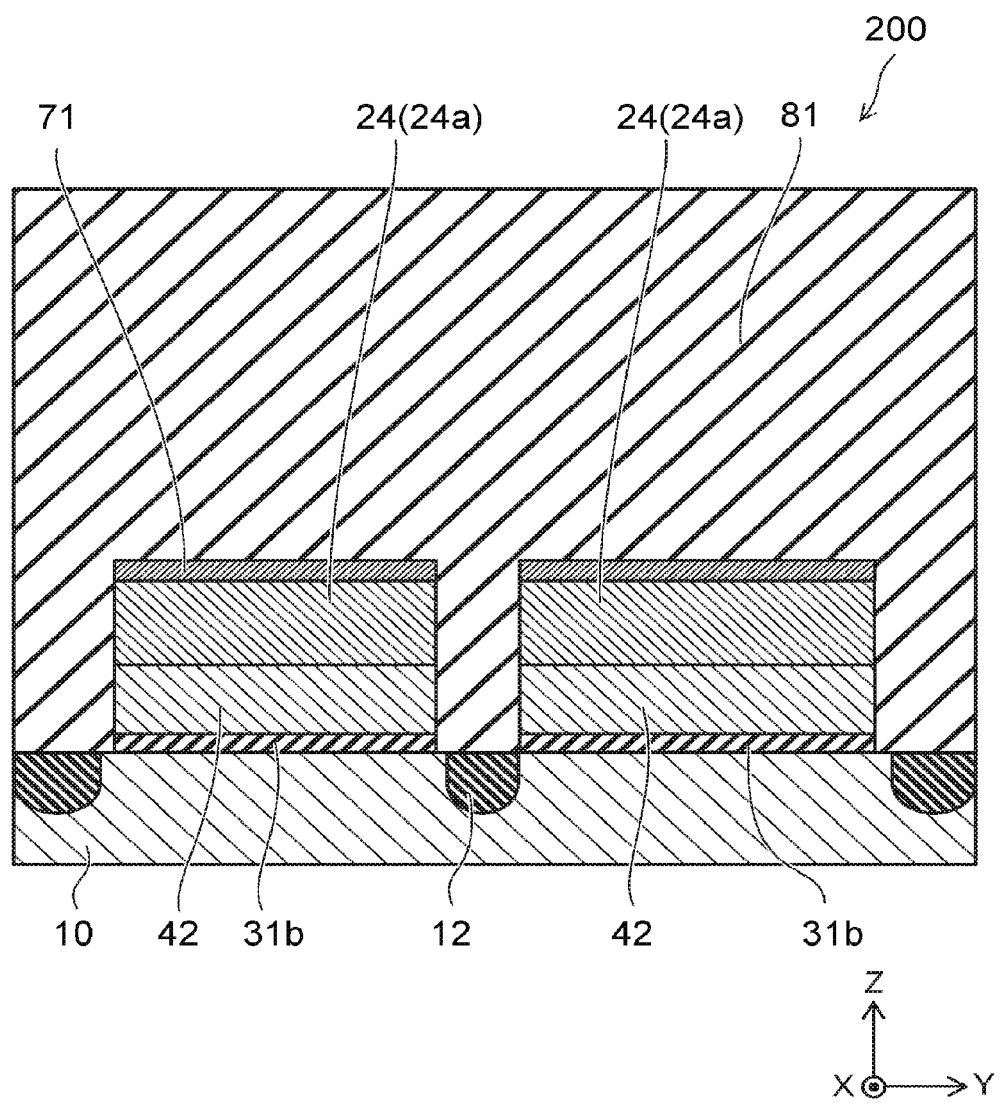

FIGS. 21 and 22 are cross-sectional views of the semiconductor device according to this embodiment.

FIG. 21 is a cross-sectional view illustrating a cross-section along the line D-D' illustrated in FIG. 20. FIG. 22 is a cross-sectional view illustrating a cross-section along the line E-E' illustrated in FIG. 20.

As illustrated in FIG. 20, an element separation film 12 and a third control gate electrode layer 23 do not overlap each other in the Z-direction in a semiconductor device 200 according to this embodiment. The element separation film 12 and a fourth control gate electrode layer 24 do not overlap each other in the Z-direction.

As illustrated in FIG. 21, a first gate electrode layer 41 does not overlap the element separation film 12 in the Z-direction. As illustrated in FIG. 22, a second gate electrode layer 42 does not overlap the element separation film 12 in the Z-direction. The configuration and manufacturing method are otherwise the same as those of the first embodiment.

This embodiment allows the control gate electrode layer 20 and the gate electrode layer 40 to be processed simultaneously as in the first embodiment. Thus, it is possible to reduce the number of manufacturing processes for the semiconductor device.

In the embodiment, the third control gate electrode layer 23 and the first gate electrode layer 41 do not overlap the element separation film 12 in the Z-direction. Also, the fourth control gate electrode layer 24 and the second gate electrode layer 42 do not overlap the element separation film 12 in the Z-direction. Thus, the control gate electrode layers (third control gate electrode layer 23 and fourth control gate electrode layer 24) and the gate electrode layers (first gate electrode layer 41 and second gate electrode layer 42) do not take up any space on the element separation film 12. This makes it possible to reduce the length of the element separation film 12 in the Y-direction. Thus, it is possible to reduce the size of the semiconductor device.

A third embodiment will be described.

Figure 23:
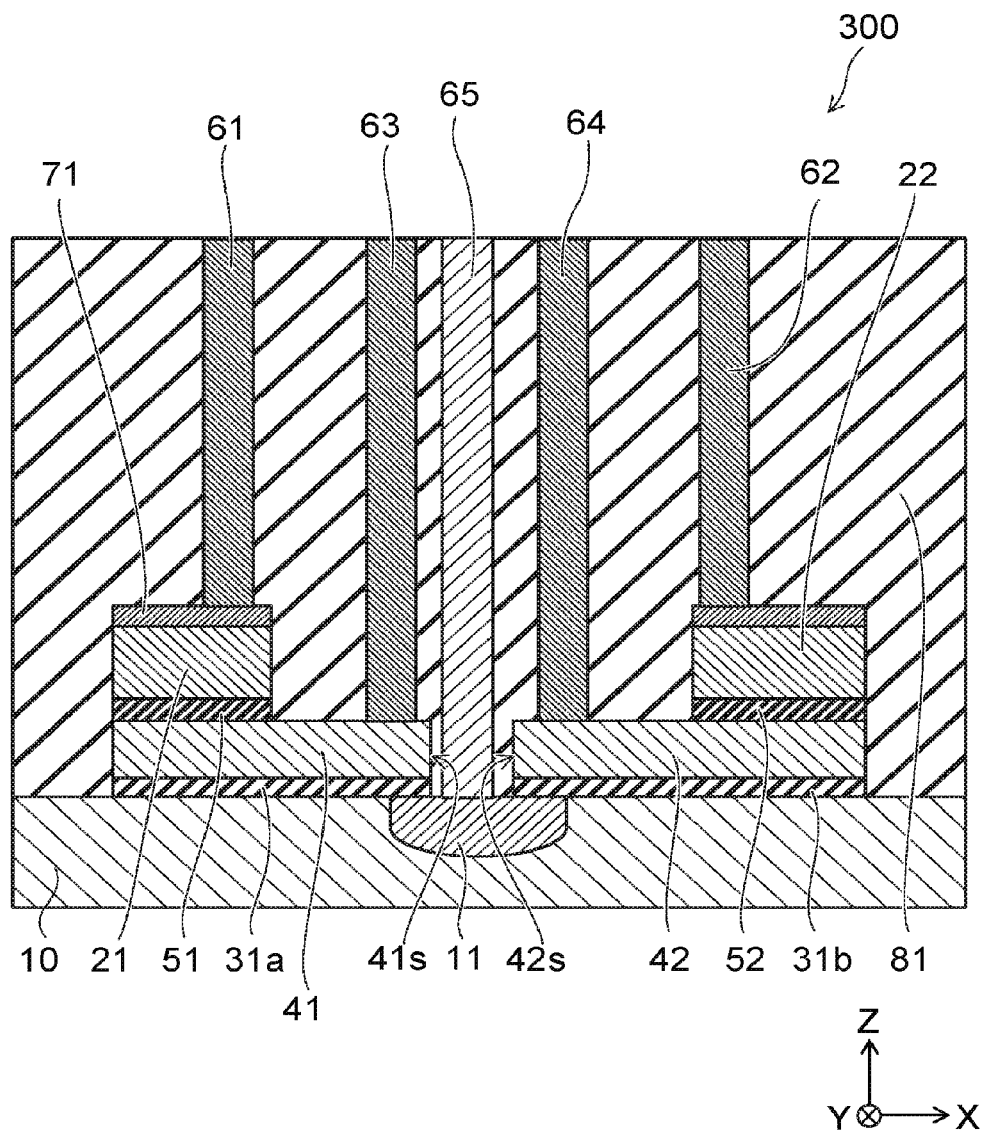
FIG. 23 is a cross-sectional view illustrating a semiconductor device according to a third embodiment.

FIG. 23 is a cross-sectional view illustrating a semiconductor device according to the third embodiment.

Figure 24:
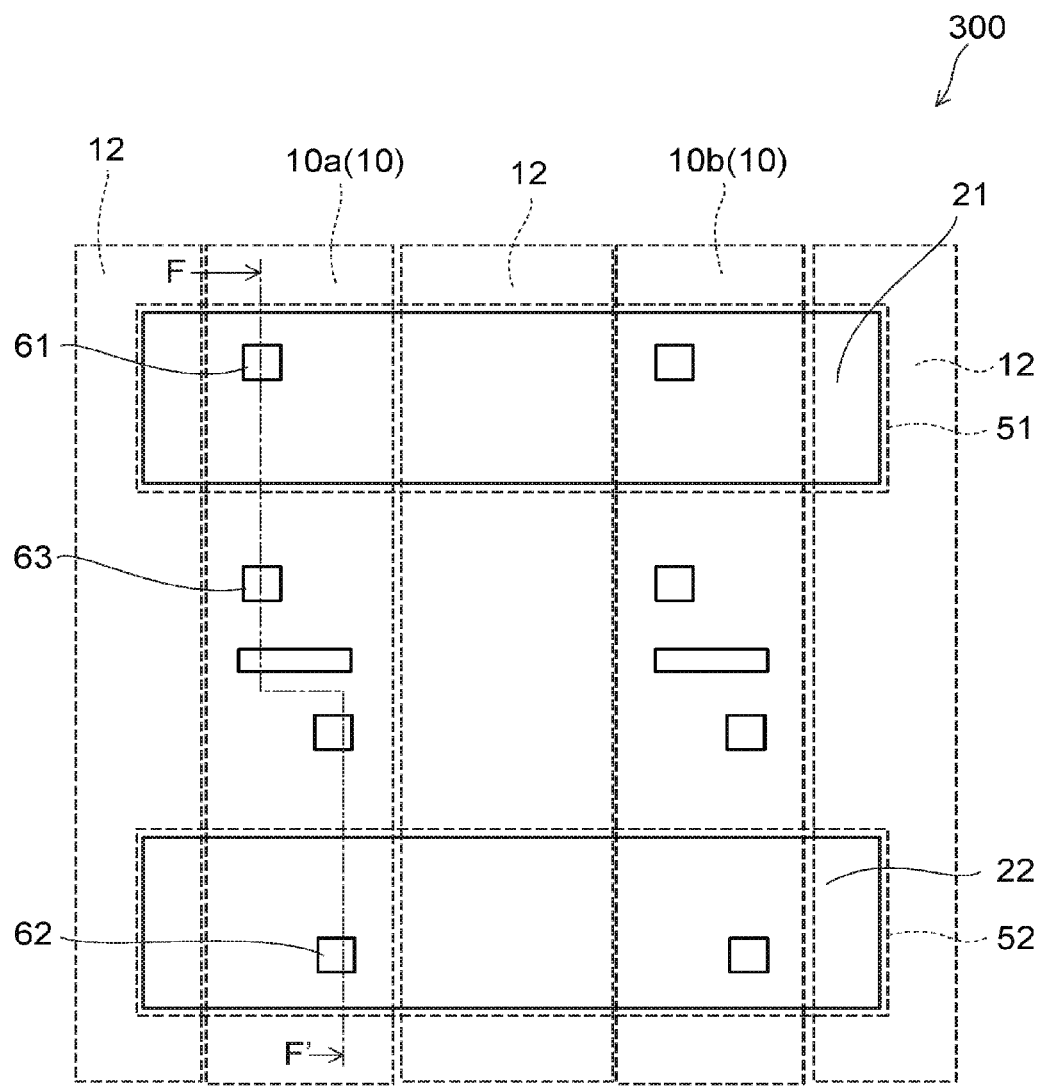
FIG. 24 is a plan view illustrating the semiconductor device according to the third embodiment.

FIG. 24 is a plan view illustrating the semiconductor device according to the third embodiment.

FIG. 23 is a process cross-sectional view illustrating a cross-section along the line F-F' illustrated in FIG. 24.

As illustrated in FIGS. 23 and 24, a semiconductor device 300 according to this embodiment is provided with neither a third control gate electrode layer 23 nor a fourth control gate electrode layer 24. As illustrated in FIG. 23, a third contact plug 63 is electrically connected to a first gate electrode layer 41 without the third control gate electrode layer 23 placed between the third contact plug 63 and the first gate electrode layer 41. A fourth contact plug 64 is electrically connected to a second gate electrode layer 42 without the fourth control gate electrode layer 24 placed between the fourth contact plug 64 and the second gate electrode layer 42. The configuration is otherwise similar to that of the semiconductor device 200 according to the second embodiment.

In the semiconductor device 200, the first gate electrode layer 41, the gate insulating film 31a, and the semiconductor substrate 10 function as a capacitative element, for example. The first control gate electrode layer 21, the first interlayer insulating film 51, the first gate electrode layer 41, the gate insulating film 31a, and the semiconductor substrate 10 function as a capacitative element. The second gate electrode layer 42, the gate insulating film 31b, and the semiconductor substrate 10 function as a capacitative element.

The second control gate electrode layer 22, the second interlayer insulating film 52, the second gate electrode layer 42, the gate insulating film 31b, and the semiconductor substrate 10 function as a capacitative element.

A manufacturing method of this embodiment will be described.

Figure 25:
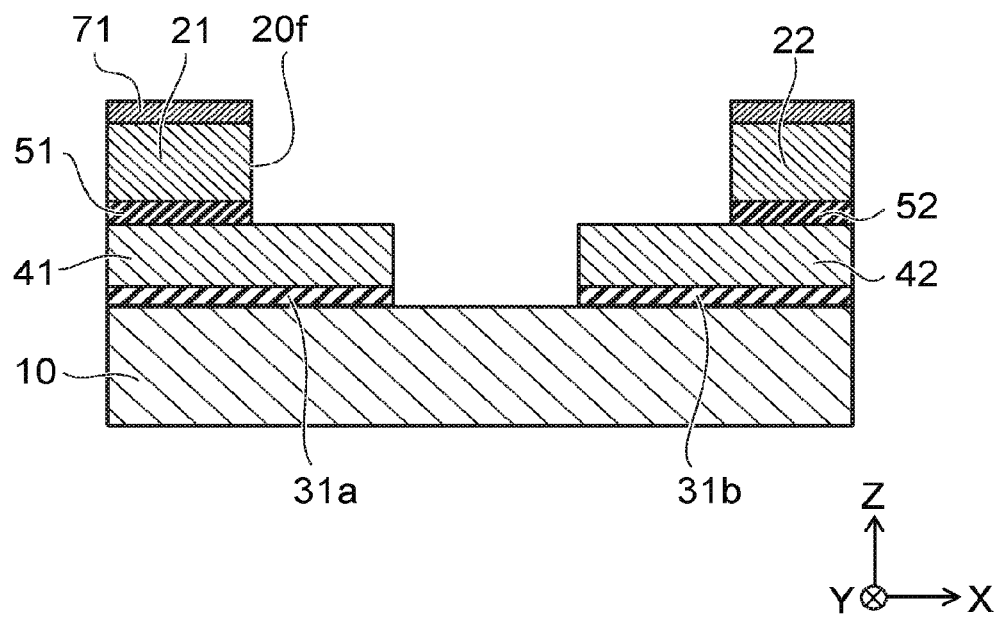
FIG. 25 is a process cross-sectional view illustrating a method for manufacturing the semiconductor device according to the third embodiment.

FIG. 25 is a process cross-sectional view illustrating a method for manufacturing the semiconductor device according to the third embodiment.

Similar to the first embodiment, the processes illustrated in FIGS. 5 to 9 are performed.

As illustrated in FIG. 25, anisotropic etching such as RIE is performed on a region overlapping the groove 50a, a portion of the first interlayer insulating film 51, and a portion of the second interlayer insulating film 52 in the Z-direction. In this manner, the control gate electrode layer 20 is separated into the first control gate electrode layer 21 and the second control gate electrode layer 22. Also, the area directly below the gate electrode layer 40 and the groove 50a of the gate insulating film 31 is removed by etching. This forms the groove 20f.

The gate electrode layer 40 is also separated into the first gate electrode layer 41 and the second gate electrode layer 42. At this time, the first interlayer insulating film 51 and the second interlayer insulating film 52 function as etching stoppers. Thus, the gate electrode layers (first gate electrode layer 41 and second gate electrode layer 42) under the first interlayer insulating film 51 and the second interlayer insulating film 52 remain.

Then, through a similar process to the first embodiment, the semiconductor device 300 according to this embodiment is manufactured.

As in the first embodiment, the control gate electrode layer 20 and the gate electrode layer 40 can be processed simultaneously. Thus, it is possible to reduce the number of manufacturing processes for the semiconductor device.

In this embodiment, similar to the second embodiment, the first gate electrode layer 41 does not overlap the element separation film 12 in the Z-direction. Also, the second gate electrode layer 42 does not overlap the element separation film 12 in the Z-direction. Thus, the gate electrode layers (first gate electrode layer 41 and second gate electrode layer 42) do not take up any space on the element separation film 12. This makes it possible to reduce the size of the element separation film 12. Thus, it is possible to reduce the size of the semiconductor device.

According to the embodiments described above, it is possible to realize a semiconductor device and a method for manufacturing the same in which the number of manufacturing processes is reduced.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention. Additionally, the embodiments described above can be combined mutually.

What is claimed is:

1. A semiconductor device comprising:
  a substrate;
  a first electrode layer separated from the substrate in a first direction;

a second electrode layer separated from the substrate in the first direction and separated from the first electrode layer in a second direction perpendicular to the first direction;

a third electrode layer provided between the first electrode layer and the second electrode layer, the third electrode layer including a first region and a second region, the second region being provided between a part of the first region and the first electrode layer;

a fourth electrode layer provided between the second electrode layer and the third electrode layer;

a first gate electrode layer provided between the first electrode layer and the substrate and between the third electrode layer and the substrate;

a second gate electrode layer provided between the second electrode layer and the substrate and between the fourth electrode layer and the substrate, the first gate electrode layer being electrically connected to the first region;

a first gate insulating film provided between the first gate electrode layer and the substrate;

a second gate insulating film provided between the second gate electrode layer and the substrate;

a first interlayer insulating film provided between the first electrode layer and the first gate electrode layer and between the second region and the first gate electrode layer; and a second interlayer insulating film provided between the second electrode layer and the second gate electrode layer and between at least a part of the fourth electrode layer and the second gate electrode layer, the third electrode layer including a first edge face on a side of the fourth electrode layer, the first edge face being included in the first region, a part of the first edge face overlapping the first interlayer insulating film in the second direction, at least a part of the first region being provided between the second region and the fourth electrode layer and between the first interlayer insulating film and the fourth electrode layer, the first gate electrode layer including a second edge face on a side of the fourth gate electrode layer, the second edge face being provided along the part of the first edge face.

2. The device according to claim 1, wherein
the fourth electrode layer includes a third edge face provided on a side of the third electrode layer,
the fourth electrode layer includes a third region and a fourth region;
the second gate electrode layer includes a fourth edge face provided on a side of the first gate electrode layer;
the third region is provided between the third electrode layer and the fourth region and between the second interlayer insulating film and the third electrode layer,
the third region is electrically connected to the second gate electrode layer,
the third region includes the third edge face,
the second interlayer insulating film is provided between the fourth region and the second gate electrode layer, and
a part of the third edge face overlaps the second interlayer insulating film in the second direction, the third edge face is provided along the fourth edge face.

3. The device according to claim 2, wherein the third edge face is continuous with the fourth edge face in the first direction.

4. The device according to claim 1, wherein the first edge face is continuous with the second edge face in the first direction.

* * * * *